(12) United States Patent
Sachan

(10) Patent No.: US 7,277,308 B2
(45) Date of Patent: Oct. 2, 2007

(54) HIGH PERFORMANCE AND LOW AREA WRITE PRECHARGE TECHNIQUE FOR CAMS

(75) Inventor: Rashmi Sachan, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/280,488

(22) Filed: Nov. 16, 2005

(65) Prior Publication Data

US 2006/0250833 A1    Nov. 9, 2006

(30) Foreign Application Priority Data

Jun. 5, 2005    (IN)    ........................ 536/CHE/2005

(51) Int. Cl.
    *G11C 15/00*    (2006.01)
(52) U.S. Cl. ............... 365/49; 365/185.23; 365/189.01
(58) Field of Classification Search .................. 365/49, 365/203, 230.06, 189.01, 185.22, 185.23
    See application file for complete search history.

(56) References Cited

U.S. PATENT DOCUMENTS 6,845,025 B1 *  1/2005  Nataraj ........................ 365/49
7,002,822 B2 *  2/2006  Kang et al. .................. 365/49

* cited by examiner

*Primary Examiner*—Gene N. Auduong
(74) *Attorney, Agent, or Firm*—Alan K. Stewart; W. James Brady; Frederick J. Telecky, Jr.

(57) ABSTRACT

A technique to pre-charge a CAM block array that includes a plurality of CAM blocks that is organized into at least one rectangular array having rows each having a plurality of CAM blocks, a group of CAM cells and associated read/write bit lines connecting the group of CAM cells to a write/search driver and one or more precharge circuits. In one example embodiment, this is accomplished by precharging each read/write bit line substantially after completing a read cycle using the one or more precharge circuits. Then, precharging each read/write bit line substantially after completing a write cycle using a write/search bit line decoder and driver circuit, followed by precharging each search bit line in the CAM block array using the write/search bit line decoder and driver circuit substantially after completing a search operation.

2 Claims, 6 Drawing Sheets

HIGH PERFORMANCE AND LOW AREA WRITE PRECHARGE TECHNIQUE FOR CAMS

TECHNICAL FIELD OF THE INVENTION

The present invention relates generally to digital integrated circuits, and more particularly relates to content addressable memories (CAMs).

BACKGROUND OF THE INVENTION

Content addressable memory (CAM) arrays are commonly used in cache systems, and other address translation systems, of high speed computing systems. They are also useful in high-speed network routers, and many other applications known in the art of computing.

The CAM arrays are typically comprised of a plurality of rows, each row having multiple CAM blocks and each CAM block has plurality of CAM cells. The CAM arrays are characterized by circuitry capable of generating a "local match" output for each CAM block in a row and a "global match" output for each row of CAM blocks in the CAM array thereby indicating whether any location of the array contains a data pattern that matches a query input and the identity of that location. Each CAM cell of a CAM array typically has the ability to store a unit of data, and the ability to compare that unit of data with a unit of a query input. Each CAM block has the ability to generate the local match output. A compare result indication of each CAM block, which is a local match (LMAT) signal, in a row is combined to produce a global match (GMAT) signal for the row to indicate whether the row of CAM cells contains a stored word matching a query input. The GMAT signals from each row in the CAM array together constitute global match output signals of the array; these signals may be encoded to generate the address of matched locations or used to select data from rows of additional memory.

Each CAM cell in each column of a CAM array is typically connected to a common read/write bit line and a search bit line. The common read/write bit line is used to write the data to a pair of memory cells, which can be part of a ternary CAM (TCAM) cell or a single memory cell, such as a binary CAM. Each memory cell is accessed using a word line which is decoded using an input address. The common read/wire bit line is also used for reading the data from a memory cell. The differential developed across the read/write bit lines are sensed using a sense amplifier during a read cycle.

Further, each CAM cell in each column in the CAM arrays is typically connected to a common query data line, also referred to as a common search data line. The common search data line enables simultaneous data searching in each CAM cell in a column from a query input. The common search data line can also be used as a write data line, when the CAM array is based on a PMOS compare circuit.

The unit of data that is stored in a CAM array cell is often binary, having two possible states: logic one, and logic zero. The CAM blocks of these arrays produce a local match compare result if the query input is equal to the data stored in the CAM cells in the CAM blocks, and a mismatch result if otherwise. Whereas, TCAM cells can store three states: logic one, logic zero, and don't care. TCAM blocks of these TCAM arrays produce a local match compare result if either the query input is equal to the data stored in the CAM cells in the TCAM blocks, the query input contains a don't care state, or the data stored is a don't care data. The TCAM arrays produce a mismatch result otherwise. The TCAM arrays are particularly useful in address translation systems that allow variably sized allocation units.

Typically, in a CAM array, the common read/write bit lines are precharged after each write or read cycle using precharge devices. Generally, for larger memories, the precharge devices are located on either end of the write bit lines to decrease precharge time. In general, the precharge time affects the cycle time of a CAM. In a read cycle, the read/write bit lines are not allowed to discharge to ground and can be precharged back after a required differential is built up. Whereas, in a write cycle, the read/write bit lines discharge all the way to ground and hence the time required to precharge the read/write bit lines after a write cycle can be considerably higher than the time required to precharge the read/write bit lines after a read cycle and therefore can affect the cycle time.

One conventional technique uses significantly large precharge devices to reduce the time required to precharge during a write cycle. Another conventional technique partitions the CAM array into smaller sections to reduce the time required to precharge after a write operation. However, these techniques generally result in requiring a larger silicon area and can be very cumbersome to implement.

SUMMARY OF THE INVENTION

According to an aspect of the subject matter, there is provided a method for pre-charging a CAM block array, the method including the steps of, precharging each read/write bit line substantially after completing a read cycle using one or more precharge circuits, precharging each read/write bit line substantially after completing a write cycle using a write/search bit line decoder and driver circuit, and precharging each search bit line in the CAM block array using the write/search bit line decoder and driver circuit substantially after completing a search operation.

DETAILED DESCRIPTION OF THE INVENTION

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
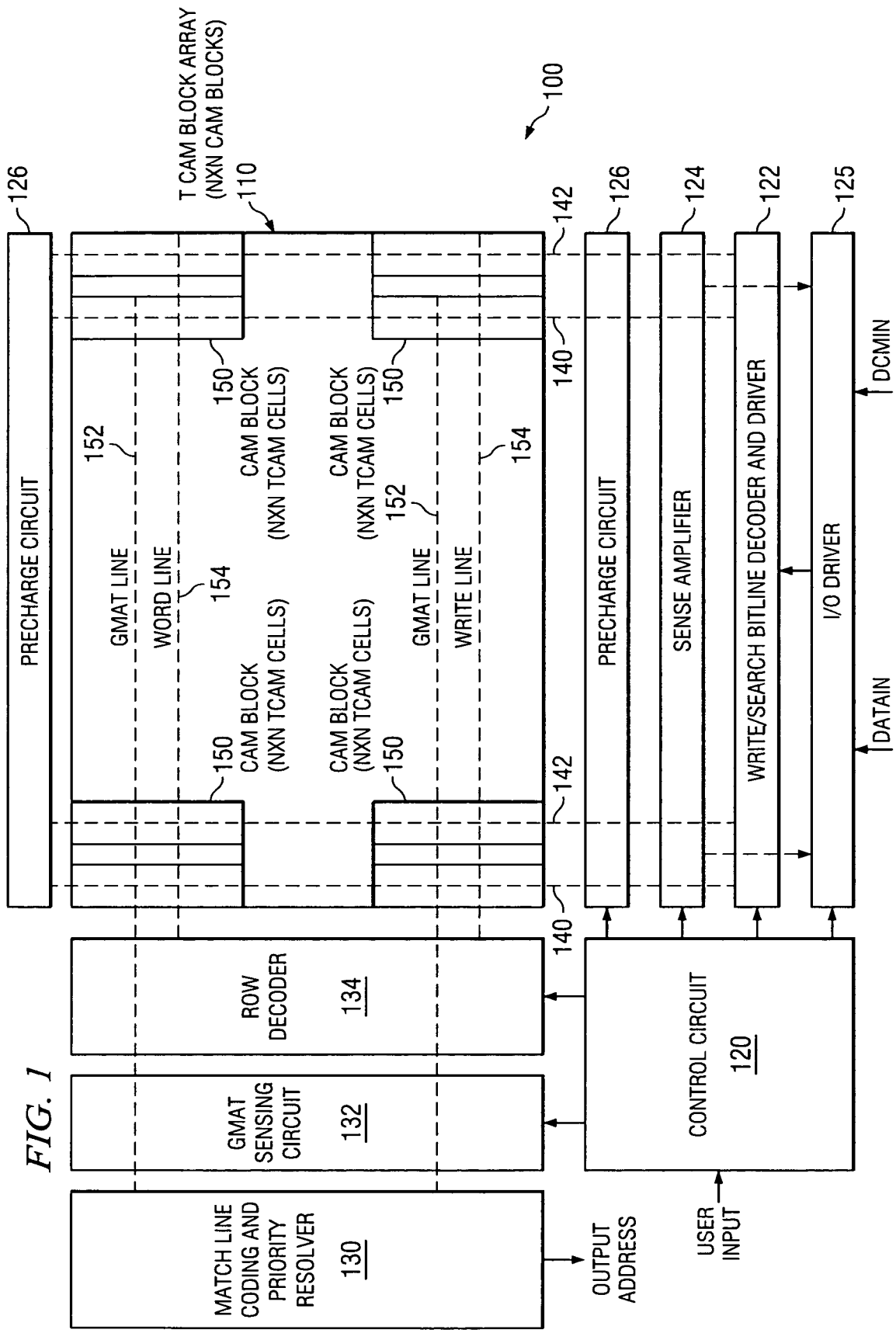
FIG. 1 is a schematic diagram of a CAM system according to an embodiment of the present invention.

Referring now to FIG. 1, there is illustrated an example embodiment of a CAM system 100 according to the present invention. The CAM system 100 includes a TCAM block array 110, a control circuit 120, a write/search bit line decoder and driver circuit 122, a sense amplifier 124, a pair of precharge circuits 126 and an input output (I/O) driver 125. As shown in FIG. 1, the CAM system 100 further includes a match line coding and priority resolver 130, a GMAT sensing circuit 132, and a row decoder 134.

Further as shown in FIG. 1, the TCAM block array 110 includes multiple CAM blocks 150 which are organized into at least one rectangular array having rows each having a plurality of CAM blocks. In some embodiments, the CAM block array 110 is arranged to include (M×N) CAM blocks having M number of rows and N number of columns. As shown in FIG. 1, each of the plurality of CAM blocks has an associated match line (GMAT line) 152 and a word line 154.

Figure 2:
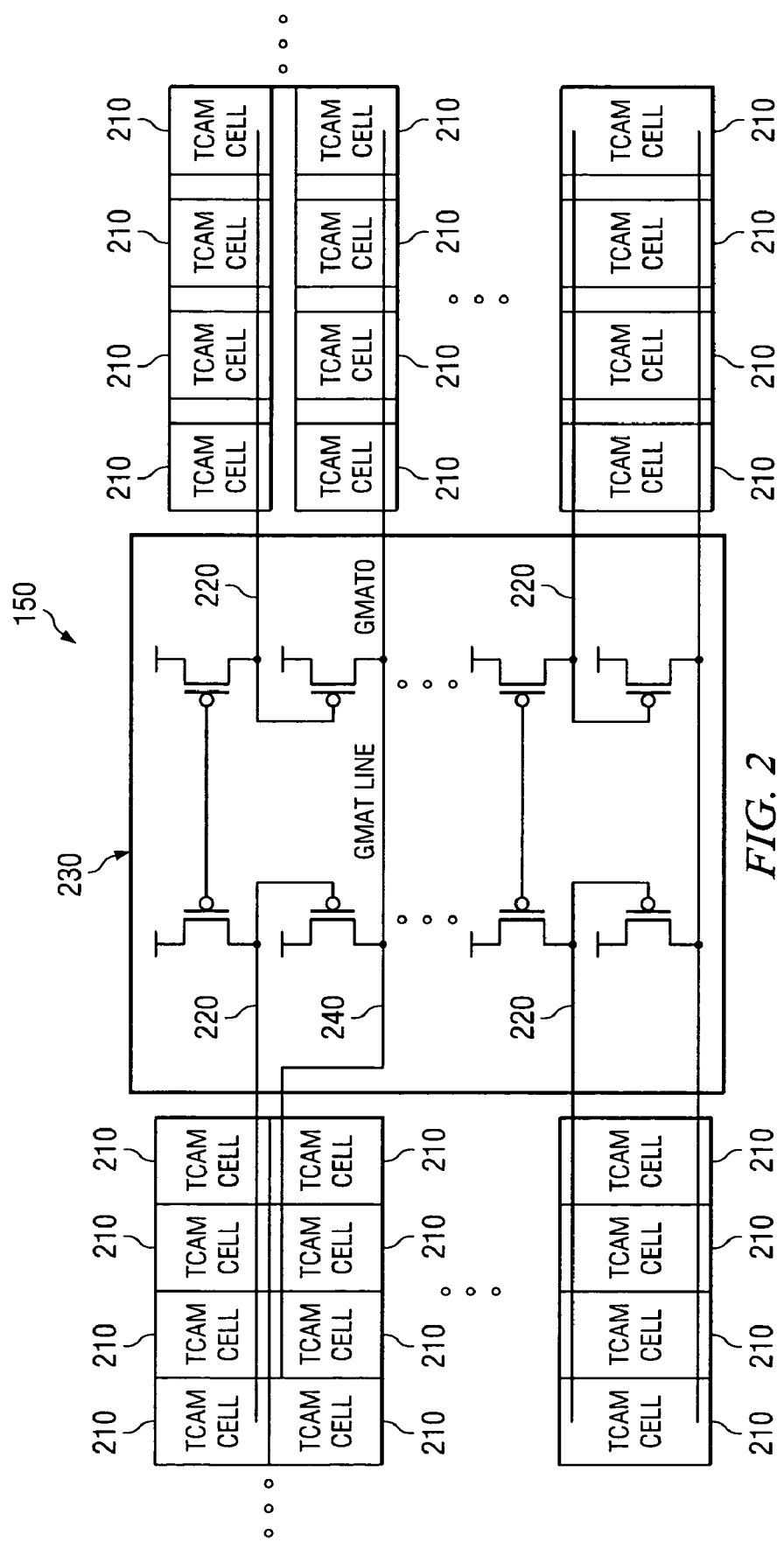
FIG. 2 is a schematic diagram of a CAM block and its associated conversion circuitry according to an embodiment of the present invention, such as those shown in FIG. 1.

Referring now to FIG. 2, there is illustrated an example embodiment of a CAM block 150. As shown in FIG. 2, each CAM block 150 includes a plurality of TCAM cells that are arranged into a rectangular array such that each TCAM cell 210 is associated with a row and a column in the CAM block 150. In some embodiments, each CAM block 150 includes (m×n) TCAM cells arranged in a rectangular array of m number of rows and n number of columns. In some embodiments, each column in the rectangular array has a search bit line and a search complement bit line, which are connected to each of the associated plurality of TCAM cells 210.

Further as shown in FIG. 2, the plurality of TCAM cells 210 in each CAM block 150 are connected to an associated LMAT line 220. The plurality of TCAM cells 210 can also be a plurality of CAM cells. In addition, each column in the CAM block array 110 has a read/write bit line 140 and a complement read/write bit line 142 (shown in FIG. 1), which are connected to each of the associated plurality of TCAM cells 210.

As shown in FIG. 1, each read/write bit line 140 and each read/write complement bit line 142 is connected to the one or more precharge circuits 126, the sense amplifier 124, and the write/search bit line decoder and driver circuit 122.

Referring back to FIG. 2, each of the multiple CAM blocks 150 includes a conversion circuit 230. Each LMAT line 220 is further connected to an associated GMAT line 240 via the conversion circuit 230. In some embodiments, each of the plurality of TCAM cells 210 includes at least one memory element for storing a data bit and at least one comparison circuit for comparing the stored data bit with a received compare data bit.

Figure 3:
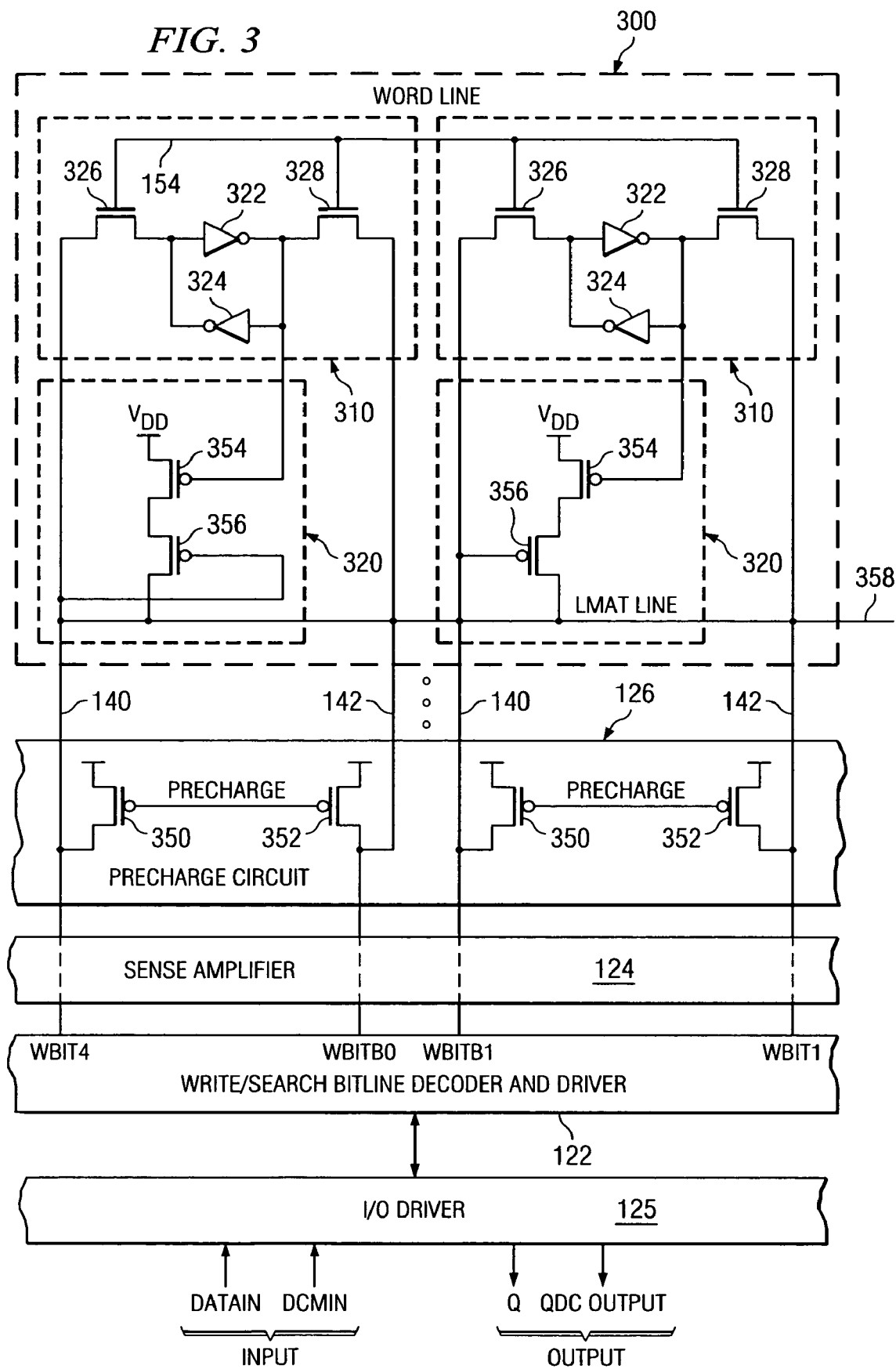
FIG. 3 is a schematic diagram of a PMOS compare circuitry based TCAM cell in a CAM block of a CAM block array according to an embodiment of the present invention, such as those shown in FIGS. 1 and 2.

Referring now to FIG. 3, there is illustrated an example embodiment of a PMOS compare circuitry based TCAM cell 300 used in the CAM block 150 of the CAM block array 110. As shown in FIG. 3, the TCAM cell 300 includes a pair of memory elements 310 and their associated PMOS based compare circuitry 320. The present invention is not limited to TCAM cell based CAM block arrays. It can be based on any other type of CAM cell. In some embodiments, each memory element in a CAM cell includes a static random access memory (SRAM) cell and its associated compare circuitry. In these embodiments, the CAM cell stores one data bit. Whereas a TCAM, such as the one shown in FIG. 3, includes two memory elements, such as SRAM cells and can store two data bits. The TCAM cells have the capability to store and search "don't cares" as well.

As shown in FIG. 3 each TCAM cell 300 includes two back-to-back inverters 322 and 324. Also as shown in FIG. 3, the back-to-back inverters 322 and 324 are coupled to a pair of NMOS transistors 326 and 328. These back-to-back inverters 322 and 324 can be accessed via the gates of the pairs of NMOS transistors 326 and 328 and the word line 154. Also, these back-to-back inverters 322 and 324 can be accessed via the drains of the pairs of NMOS transistor 326 and 328 and the read/write and read/write complement bit lines 140 and 142. Also, it can be seen in FIG. 3, that the PMOS based compare circuitry 320 is coupled to the read/write bit line 140 and the read/write complement bit line 142. The PMOS based circuitry shown in FIG. 3, includes a pair of PMOS transistors 354 and 356. In case of a mismatch during a compare operation, the LMAT line is pulled-up high.

It can be seen that the associated read/write bit lines and the associated read/write complement bit lines 140 and 142, respectively, are coupled to the one or more precharge circuits 126, the sense amplifier 124, and the write/search bit line decoder and driver circuit 122. Further as shown in FIG. 3, the I/O driver 125 receives the external input signals DATAIN and DCMIN and output signals Q, and DDC OUTPUT from the control circuit 120 (shown in FIG. 1). The DATAIN is a user sent input data sent to compare stored data. The DCMIN is a user data compare input (used only in TCAM's). For example, if DCM is high then the input value is considered as a don't care input and value at DATAIN is not compared. The Q is a data output signal and the QDC is a data compare output signal.

Further as shown in FIG. 3, the one or more precharge circuits 126 include a pair of pull-up PMOS transistors 350 and 352 that are coupled to the associated read/write bit line 140 and read/write complement bit line 142.

Figure 4:
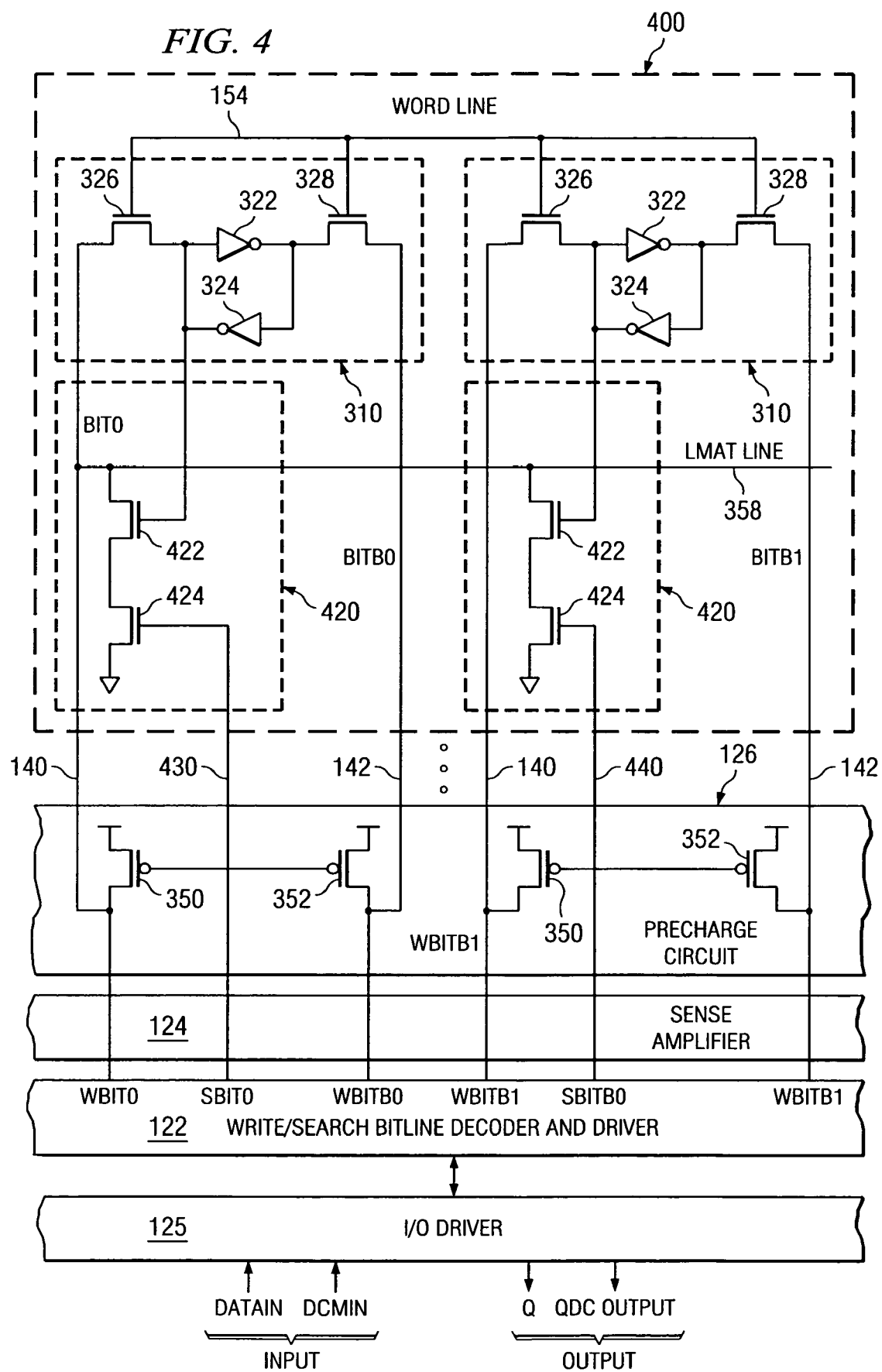
FIG. 4 is a schematic diagram of a NMOS compare circuitry based TCAM cell in a CAM block of a CAM block array according to an embodiment of the present invention, such as those shown in FIGS. 1 and 2.

Referring now to FIG. 4, there is illustrated an example embodiment of a NMOS compare circuitry based TCAM cell 400 used in the CAM block 150 of the CAM block array 110. As shown in FIG. 4, the TCAM cell 400 includes the pair of memory elements 310 and their associated NOMS based compare circuitry 420. Again, it can be seen that the associated read/write bit lines and the associated read/write complement bit lines 140 and 142, respectively, are coupled to the one or more precharge circuits 126, the sense amplifier 124, and the write/search bit line decoder and driver circuit 122. Similarly as shown in FIG. 3, the I/O driver 125 shown in FIG. 4 receives the external input signals DATAIN and DCMIN and output signals Q and QDC OUTPUT (shown in FIG. 1). In addition to what is shown in FIG. 3, FIG. 4 shows a search bit line 430 and a search complement bit line 440 connected between the associated NMOS based compare circuitry 420 and the write/search bit line decoder and driver circuit 122. The NMOS based compare circuitry 420 shown in FIG. 4 requires using separate search bit lines, whereas the PMOS based compare circuitry 320 shown in FIG. 3 uses the same read/write bit lines to search the data bits stored in the memory elements during a search cycle. The NMOS based compare circuitry 420 includes a pair of NMOS transistors 422 and 424. In case of a mismatch, the LMAT line 358 will be pulled low.

Figure 5:
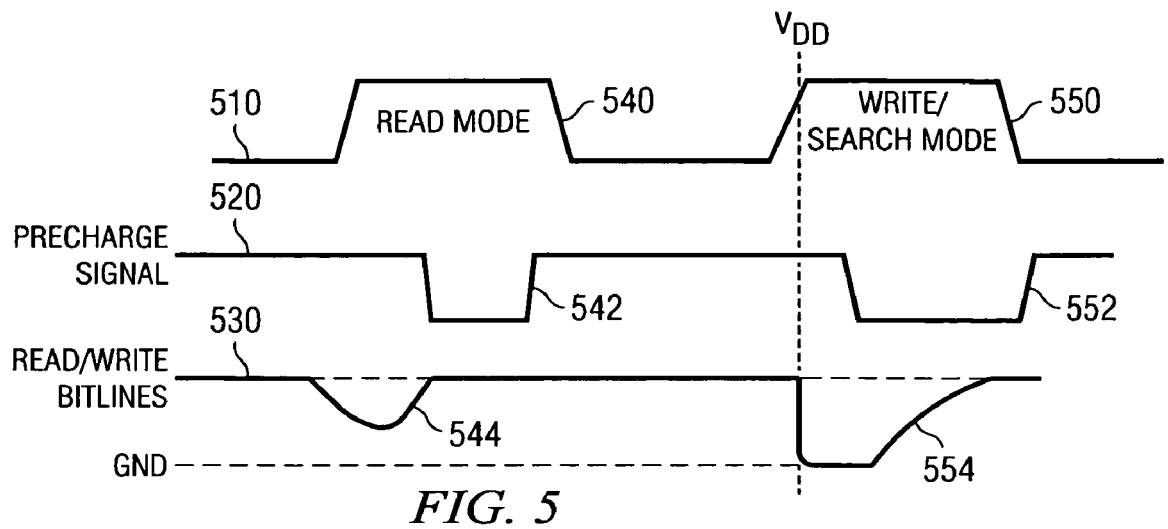
FIG. 5 illustrates example timing signals incurred on a read/write bit line in a CAM array during an evaluation/precharge sequence.

Referring now to FIG. 5, there is illustrated example timing signals 510, 520, and 530 incurred on a read/write bit line in a CAM array during an evaluation/precharge sequence. The timing signal 510 shows the duration of a read mode 540 and a write/search mode 550 in a typical read operation and write/search operation. The timing signal 520 shows the precharge signals 542 and 552 occurring during the read mode 540 and the write/search mode 550, respectively. In addition, the timing signal 530 illustrates the discharge levels of the read/write bit lines and read/write complement bit lines 140 and 142 (shown in FIG. 1), respectively, during the read mode 540 and the write/search mode 550. It can be seen that during the read mode 540, the read/write bit lines 140 and the read/write complement bit lines 142 (shown in FIG. 1) do not discharge to GND 544 and therefore can be precharged back to VDD fairly quickly after a required differential is built up. Whereas, during the write/search mode 550 the read/write bit lines 140 and the read/write complement bit lines 142 (shown in FIG. 1) discharge all the way to GND 554 and hence the time required to precharge the read/write bit lines 140 and the read/write complement bit lines 142 can be considerably higher that the time require to precharge the read/write bit lines 140 and the read/write complement bit lines 142 after a read mode 540 as shown in the timing signal 520.

Figure 6:
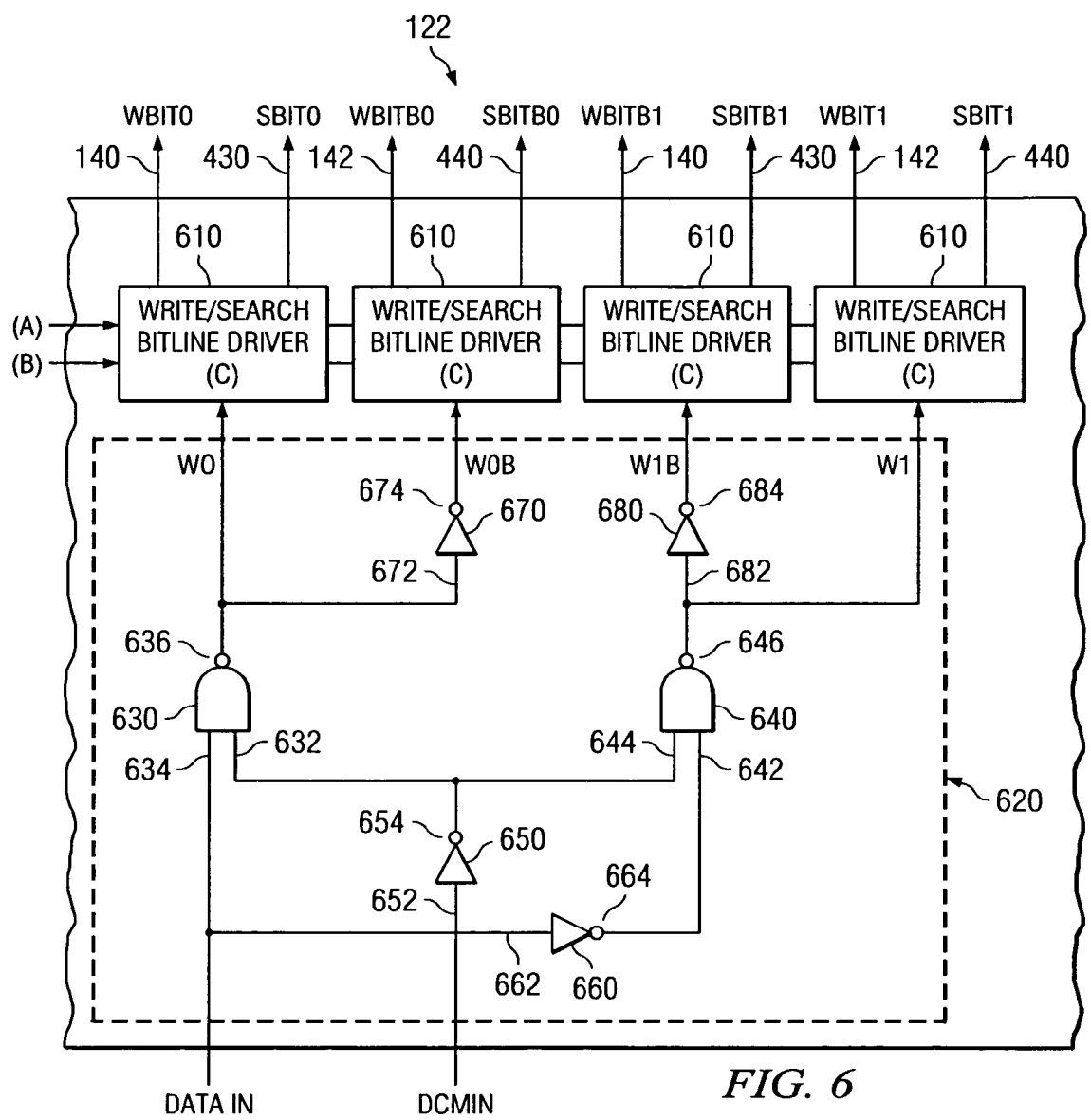
FIG. 6 is a schematic diagram of a write/search bit line decoder and driver circuit for the NMOS compare circuitry based TCAM cell according to an embodiment of the present invention, such as those shown in FIGS. 1, 2, 3 and 4.

Referring now to FIG. 6, there is illustrated an example write/search bit line decoder and driver circuit 600 for the NMOS compare circuitry based TCAM cell. As shown in FIG. 6, the write/search bit line decoder and driver circuit 600 includes a write/search bit line driver and block 610 associated with each read/write bit line 140 and the read/write complement bit line 142 and a data decoding circuit 620 to decode input signals coming from the I/O driver 125 (shown in FIG. 1).

Also shown in FIG. 6 is the search bit line and the search complement bit line associated with each write/search bit line driver and block 610 required in the write/search bit line decoder and driver circuit 600 using the NMOS compare circuitry based TCAM cell. In the case of a write/search bit line decoder and driver circuit 600 using a TCAM cell based on the PMOS compare circuitry, such as the one shown in FIG. 3, a separate search bit line and a separate search complement bit line are not required. The TCAM cell based on the PMOS circuitry (shown in FIG. 3) uses the same read/write bit lines and the read/write complement bit lines for a search during a search cycle and does not require separate search bit lines and search complement bit lines.

In some embodiments, as shown in FIG. 6, the data decoding circuit 620 includes a first NAND gate 630, a second NAND gate 640, a first inverter 650, a second inverter 660, a third inverter 670, and a fourth inverter 680. The first NAND gate includes a first input 632, a second input 634 and an output 636. The second NAND gate includes a first input 642, a second input 644, and an output 646. Further, the first inverter 650 includes an input 652 and an output 654, the second inverter 660 includes an input 662 and an output 664, the third inverter 670 includes an input 672 and an output 674, and the fourth inverter 680 includes an input 682 and an output 684.

As shown in FIG. 6, the second input 634 of the first NAND gate 630 is coupled to receive external data input (DATAIN) from the I/O driver 125 (shown in FIGS. 1, 3, and 4). The output 636 of the first NAND gate 630 is coupled to the associated write/search bit line driver and block 610. The input 652 of the first inverter 650 is coupled to receive external data complement input (DCMIN) from the I/O driver 125 (shown in FIGS. 1, 3, and 4). The output 654 of the first inverter is coupled to the first input 632 of the first NAND gate 630.

Further as shown in FIG. 6, the input 662 of the second inverter 660 is coupled to receive the DATAIN from the I/O driver 125 (shown in FIGS. 1, 3 and 4). The first input 642 of the second NAND gate 640 is coupled to the output 664 of the second inverter 660. The second input 644 of the second NAND gate 640 is coupled to the output 654 of the first inverter 650 and the first input 632 of the first NAND gate. The output 646 of the second NAND gate 640 is coupled to the associated write/search bit line driver and block 610.

Furthermore as shown in FIG. 6, the input 672 of the third inverter 670 is coupled to the output 636 of the first NAND gate 630. The output 674 of the third inverter 670 is coupled to the associated write/search bit line driver and block 610. The input 682 of the fourth inverter 680 is coupled to the output 646 of the second NAND gate 640. The output 684 of the fourth inverter 680 is coupled to the associated write/search bit line driver and block 610.

In operation, the data decoding circuit 620 described above receives the external input signals DATAIN and DCMIN. For example, if DATAIN=0, DCMIN=0, then W0(sig636)=1, W0B(sig674)=0, W1(sig682)=0, W1B(sig684)=1. Wherein W0B is complement of W0 and W1B is complement of W1.

Following table illustrates the output decoding achieved by the data decoding circuit 620.

```
DATAIN = 0  DCMIN = 0, W0 = 1, W1 = 0, WBIT0 = 0, WBITB0 = 1, WBIT1 = 1, WBITB1 = 0
DATAIN = 1  DCMIN = 0, W0 = 0, W1 = 1, WBIT0 = 1, WBITB0 = 0, WBIT1 = 0, WBITB1 = 1
DATAIN = X  DCMIN = 1, W0 = 1, W1 = 1, WBIT0 = 0, WBITB0 = 1, WBIT1 = 0, WBITB1 = 1
``` wherein W0, W1, W0B, and W1B in the above table are outputs from the data decoding circuit 620, which are used as inputs to the write/search bit line driver 122 (shown in FIG. 1).

Figure 7:
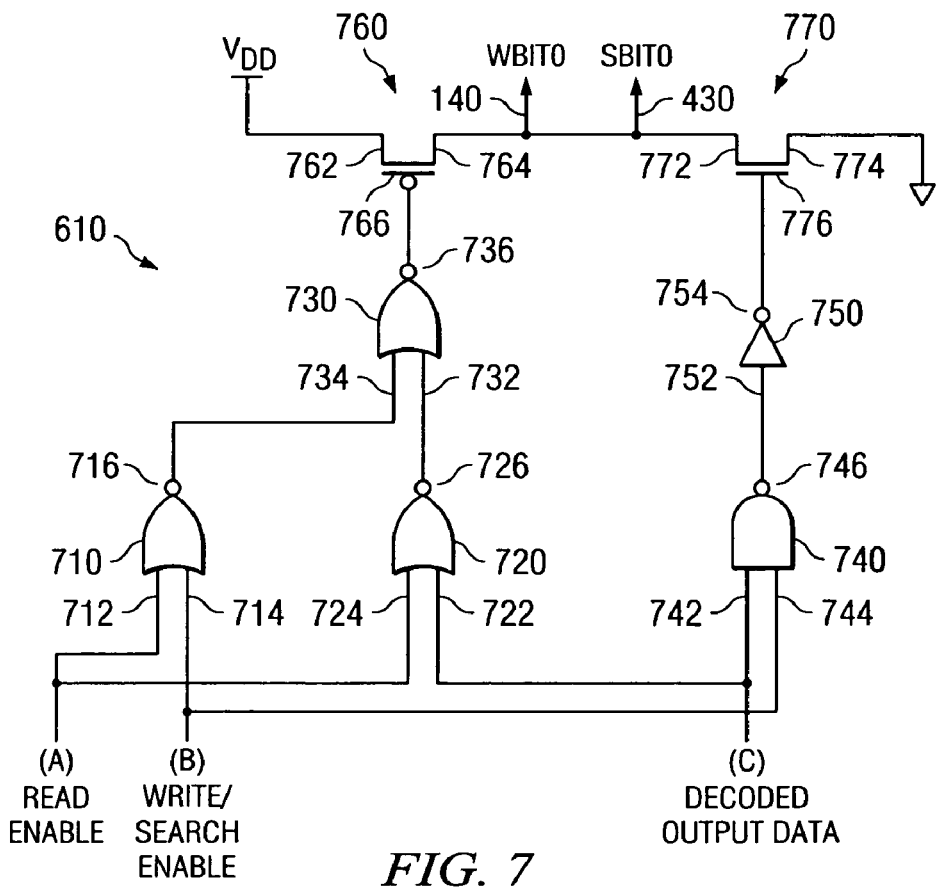
FIG. 7 is a schematic diagram of a write/search bit line driver and block according to an embodiment of the present invention, such as those shown in FIG. 6.

Referring now to FIG. 7, there is illustrated an example write/search bit line driver and block 610. As shown in FIG. 7, the write/search bit line driver and block 610 includes a first NOR gate 710, a second NOR gate 720, a third NOR gate 730, a NAND gate 740, an inverter 750, a PMOS transistor 760, and a NMOS transistor 770. The first NOR gate 710 includes a first input 712, a second input 714, and an output 716. The second NOR gate 720 includes a first input 722, a second input 724, and an output 726. The third NOR gate 730 includes a first input 732, a second input 734, and an output 736. The NAND gate 740 includes a first input 742, a second input 744, and an output 746. The inverter 750 includes an input 752 and an output 754. The PMOS transistor 760 includes a first electrode 762, a second electrode 764, and a control electrode 766. The NMOS transistor 770 includes a first electrode 772, a second electrode 774, and a control electrode 776.

As shown in FIG. 7, the first input 712 of the first NOR gate 710 is coupled to receive a read enable signal from the control circuit 120 (shown in FIG. 1). The second input 714 of the first NOR gate 710 is coupled to receive a write/search bit line driver signal from the control circuit 120 (shown in FIG. 1). The first input 742 of the NAND gate 740 is coupled to receive the write/search bit line driver signal from the control circuit 120 (shown in FIG. 1). The second input 744 of the NAND gate 740 is coupled to receive the DATAIN signal from the I/O driver (shown in FIGS. 1, 3 and 4).

Further as shown in FIG. 7, the first input 722 of the second NOR gate 720 is coupled to receive the DATAIN from the I/O driver (shown in FIGS. 1, 3, and 4). The second input 724 of the second NOR gate 720 is coupled to receive the read enable signal from the control circuit 120 (shown in FIG. 1). The first input 732 of the third NOR gate 730 is coupled to the output 726 of the second NOR gate 720. The second input 734 of the third NOR gate 730 is coupled to the output 716 of the first NOR gate 710. The input 752 of the inverter is coupled to the output 746 of the NAND gate 740.

Furthermore as shown in FIG. 7, the first electrode 762 of the PMOS transistor 760 is connected to a supply voltage VDD. The second electrode 764 of the PMOS transistor 760 is coupled to the associated read/write bit line 140 and the search bit line 430. The control electrode 766 of the PMOS transistor 760 is coupled to the output 736 of the third NOR gate 730. The first electrode 772 of the NMOS transistor 770 is coupled to the associated read/write bit line 140 and the search bit line 430. The second electrode 774 of the NMOS transistor 770 is coupled to the GND. The control electrode 776 of the NMOS transistor 770 is coupled to the output 756 of the inverter 750.

The decoding table below illustrates the operation of the above-described write/search bit line driver and block 610.

|  | Read Enable (A) | Write/Search Enable (B) | PMOS State | NMOS State |
| --- | --- | --- | --- | --- |
| Read Cycle | 1 | 0 | Disable | Disable |
| Write/Search Cycle | 0 | 1 | Enable for Data 1 | Enable for Data 0 |
| End of Write/Search Cycle | 0 | 0 | Enable | Disable |

It can be seen in the above table that in a read cycle the read enable goes to a logic high state, i.e., '1' and the write enable goes to a logic low state, i.e., '0'. In operation, during the read cycle, when the read enable signal (A) goes to the logic high state and the write/search bit line driver signal (B) goes to a logic low state, the output 726 of the second Nor gate goes to a logic low state, the output 716 of the first NOR gate goes to a logic low state, the output 746 of the NAND gate 740 will go to a logic high state, and the output 754 of the inverter 750 will go to a logic low state and the output 736 of the third NOR gate 730 will go to a logic high state. This will result in disabling both the PMOS transistor 760 and the NMOS transistor 770 as shown in the above table.

In the write/search cycle, the read enable signal (A) goes to a logic low state, i.e., '0' and the write/search bit line driver signal (B) will go to a logic high state, i.e., '1'. This results in enabling both the PMOS transistor 760 and the NMOS transistor 770 as shown in the above table. At the end of the write/search cycle, both the read enable signal (A) and the write/search bit line driver signal (B) go to a logic low state. This results in enabling the PMOS transistor 760 and disabling the NMOS transistor 770 as shown in the above table. The enabled PMOS transistor at the end of the write/search cycle will be used in precharging the read/write bit lines 140 and the read/write complement bit lines. It can be seen in FIG. 7 and the above table that the PMOS transistor 760 used in the write/search bit line driver and block 610 serves two purposes, one being using for writing during the write/search cycle and the other being using for precharging the read/write bit lines the read/write complement bit lines at the end of the write cycle. Using the write/search bit line driver and block instead of the one or more precharge circuits 126 to precharge the read/write bit lines and the read/write complement bit lines helps reduce the size of the one or more precharge circuits, which are used only during the read cycle in the above-described technique.

The above-described methods and apparatus provide various schemes to precharge conversion circuitry associated with TCAM cells in a CAM array. It is expected that the above-described methods and apparatus can also be implemented for CAM cells.

While the present subject matter has been described with reference to static memory elements, it is anticipated that dynamic memory elements can also be used to store the data bits.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

As shown herein, the present invention can be implemented in a number of different embodiments, including various methods, an apparatus, and a system. Other embodiments will be readily apparent to those of ordinary skill in the art. The elements, algorithms, and sequence of operations can all be varied to suit particular requirements.

FIGS. 1-7 are merely representational and are not drawn to scale. Certain proportions thereof may be exaggerated, while others may be minimized. FIGS. 1-7 illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The above description is intended to be illustrative, and not restrictive. Many other embodiments will be apparent to those skilled in the art. The scope of the invention should therefore be determined by the appended claims, along with the full scope of equivalents to which such claims are entitled.

The invention claimed is:

1. A write/search bit line decoder and driver circuit for a TCAM cell comprising:
    a data decoding circuit coupled to receive input signals from an I/O driver via a control circuit; and
    a write/search bit line driver and block associated with each read/write bit line and each complement read/ write line of a TCAM cell coupled between the data decoding circuit and the associated read/write bit line and the complement read/write line;

wherein each write/search bit line driver and block comprises:

a first NOR gate having a first input, a second input and an output, wherein the first input of the first NOR gate coupled to receive a read enable signal from the control circuit and wherein the second input of the first NOR gate is coupled to receive a write/search bit line driver signal from the control circuit;

a NAND gate having a first input, a second input and an output, wherein the first input of the NAND gate is coupled to receive the write/search bit line driver signal and wherein the second input of the NAND gate is coupled to receive a data input from data decoding circuit;

a second NOR gate having a first input, a second input and an output, wherein the first input of the second NOR gate is coupled to receive the data input signal and wherein the second input of the second NOR gate is coupled to receive the read enable signal;

a third NOR gate having a first input, a second input, and an output, wherein the first input of the third NOR gate is coupled to the output of the second NOR gate and the second input of third NOR gate is coupled to the output of the first NOR gate;

an inverter having an input and an output, wherein the input of the inverter is coupled to the output of the NAND gate;

a PMOS transistor having a first electrode to couple to a supply voltage (VDD), a second electrode coupled to the associated read/write bit line and the associated search bit line, and a control electrode coupled to the output of the third NOR gate; and a NMOS transistor having a first electrode to couple to the associated read/write bit line and the associated search bit line, a second electrode is coupled to a ground (GND), and a control electrode coupled to the output of the inverter.

2. The write/search bit line decoder and driver circuit of claim 1, wherein the data decoding circuit comprises:

a first NAND gate having a first input, a second input, and an output, wherein the second input is coupled to receive a data input from the I/O driver and the output coupled to the associated write/search bit line driver and block;

a first inverter having an input and an output, wherein the input is coupled to receive data complement input from the I/O driver, and wherein the output is coupled to the first input of the first NAND gate;

a second inverter having an input and an output, wherein the input is coupled to receive a data input from the I/O driver;

a second NAND gate having a first input, a second input, and an output, wherein the first input of the second NAND gate is coupled to the output of the second inverter, wherein the second input of the second NAND gate is coupled to the output of the first inverter and the first input of the first NAND gate, and wherein the output of the second NAND gate is coupled to the associated write/search bit line driver and block;

a third inverter having an input and an output, wherein the input of the third inverter is coupled to the output of the first NAND gate, and wherein the output of the third inverter is coupled to the associated write/search bit line driver and block; and a fourth inverter having an input and an output, wherein the input of the fourth inverter is coupled to the output of the second NAND gate, and wherein the output of the fourth inverter is coupled to the associated write/search bit line driver and block.

* * * * *